(12) United States Patent
Anderson et al.

(10) Patent No.: US 9,913,534 B2
(45) Date of Patent: Mar. 13, 2018

(54) EXTENDABLE ELECTRONICS ENCLOSURE

(71) Applicant: International Business Machines Corporation, Armonk, NY (US)

(72) Inventors: Dale H. Anderson, Tucson, AZ (US); Angel E. Delgado, Vail, AZ (US); John C. Elliott, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 14/810,961

(22) Filed: Jul. 28, 2015

(65) Prior Publication Data
US 2017/0034947 A1 Feb. 2, 2017

(51) Int. Cl.
| | | |
|---|---|---|
| *H05K 7/18* | (2006.01) | |
| *B65D 19/44* | (2006.01) | |
| *A47B 45/00* | (2006.01) | |
| *H05K 7/14* | (2006.01) | |
| *H04Q 1/02* | (2006.01) | |

(52) U.S. Cl.
CPC .......... *A47B 45/00* (2013.01); *H05K 7/1488* (2013.01); *H04Q 1/09* (2013.01)

(58) Field of Classification Search
CPC ........ H05K 7/18; H05K 7/1488; B65D 19/44; B65D 2519/00815; A47B 45/00
See application file for complete search history.

(56) References Cited

U.S. PATENT DOCUMENTS

| | | | |
|---|---|---|---|
| 7,986,526 B1 | 7/2011 | Howard et al. | |
| 8,327,598 B2 * | 12/2012 | Shew | H05K 7/1401 16/225 |
| 8,917,504 B2 * | 12/2014 | Medlin | G10K 11/16 361/679.46 |
| 2004/0189161 A1 | 9/2004 | Davis et al. | |
| 2008/0010935 A1 * | 1/2008 | Nagel | A47B 9/00 52/474 |
| 2014/0111070 A1 | 4/2014 | Ehlen | |
| 2014/0317902 A1 | 10/2014 | Helbig et al. | |

FOREIGN PATENT DOCUMENTS

| | | |
|---|---|---|
| CN | 1991673 A | 7/2007 |
| EP | 1883286 A2 | 1/2008 |
| WO | 2012135136 A2 | 10/2012 |

OTHER PUBLICATIONS

Disclosed Anonymously, "Flexible datacenters", An IP.com Prior Art Database Technical Disclosure, IP.com No. 000225162, IP.com Electronic Publication: Jan. 28, 2013, pp. 1-4.

* cited by examiner

*Primary Examiner* — John C Hong

(74) *Attorney, Agent, or Firm* — Steven F. McDaniel

(57) ABSTRACT

An apparatus includes a base unit configured to hold electronic equipment, a top panel, a first extension arm that is vertically extendable from a proximal position along a selected dimension of the base unit and a second extension arm that is vertically extendable from a distal position along the selected dimension of the base unit, the first extension arm slide-ably coupled to the top panel, and the second extension arm rotate-ably coupled to the top panel. A corresponding method includes providing the apparatus and raising one end of the top panel previous to raising the other end of the top panel.

20 Claims, 9 Drawing Sheets

EXTENDABLE ELECTRONICS ENCLOSURE

BACKGROUND OF THE INVENTION

The present invention relates generally to electronic equipment and specifically to enclosures and racks for holding electronic equipment.

Floor space at datacenters is a limited resource. Consequently, it is desirable to maximize the height of equipment racks and enclosures that hold the servers and other electronics associated with data centers. However, door openings, elevators, and other facility constraints may limit the size of packages that can be brought into a datacenter. Furthermore, shipping companies often restrict the size of packages that they deliver or charge a premium for packages that exceed a certain size.

SUMMARY

An apparatus includes a base unit configured to hold electronic equipment, a top panel, a first extension arm that is vertically extendable from a proximal position along a selected dimension of the base unit and a second extension arm that is vertically extendable from a distal position along the selected dimension of the base unit, the first extension arm slide-ably coupled to the top panel, and the second extension arm rotate-ably coupled to the top panel. A corresponding method includes providing the apparatus and raising one end of the top panel before raising the other end of the top panel.

DETAILED DESCRIPTION

The embodiments disclosed herein provide an equipment enclosure that can be shipped in an un-extended state and extended in height by a single individual during installation.

Figure 1:
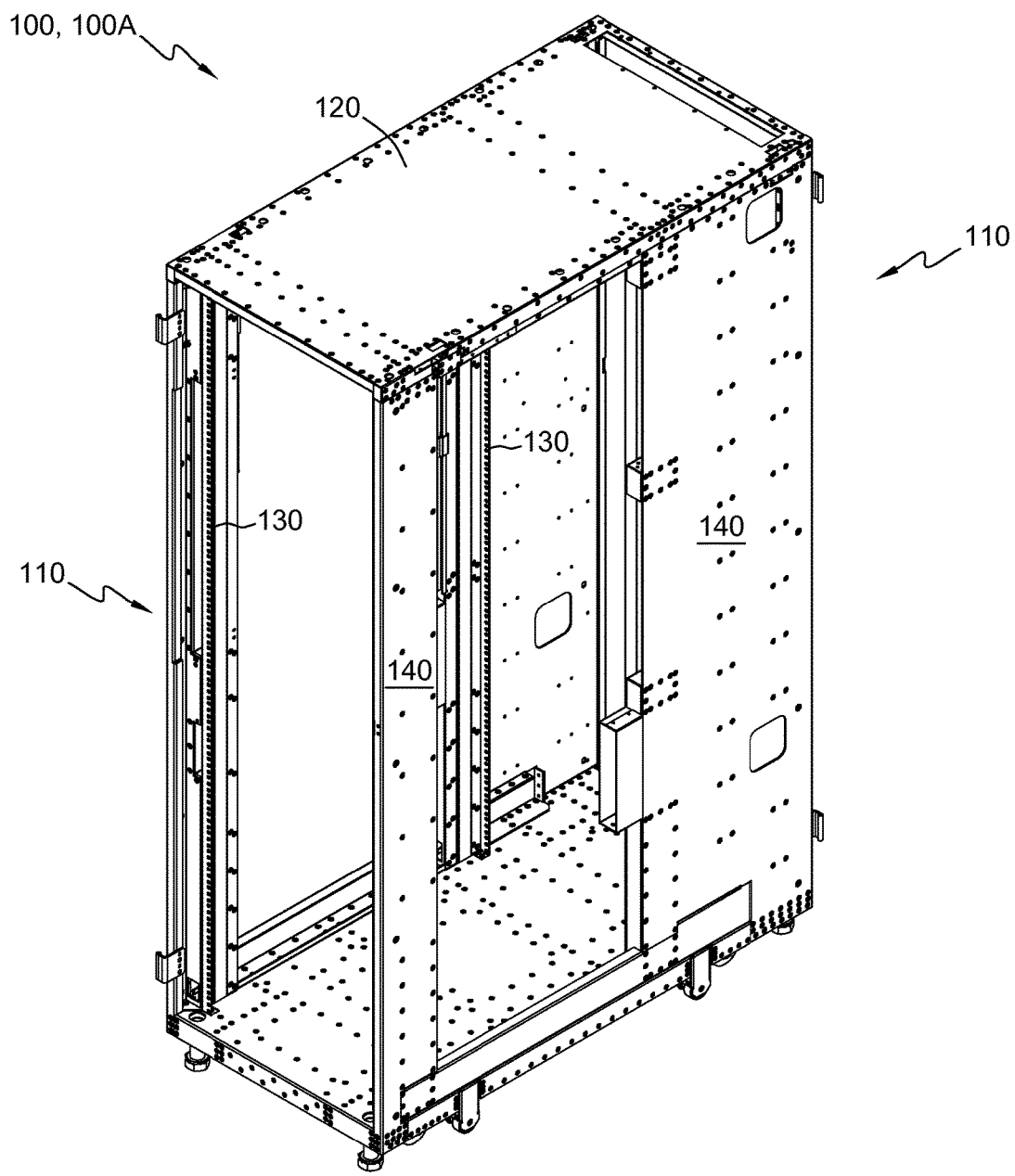
FIG. 1 is a perspective view illustration depicting one embodiment of an equipment enclosure in an un-extended state.

FIG. 1 is a perspective view illustration depicting one embodiment of an equipment enclosure 100 in an un-extended state. As depicted, the equipment enclosure 100 includes a base unit 110 and a top panel 120. The base unit 110 may have various rack elements such as rack rails 130 for mounting and holding electronic equipment within the base unit. The base unit 110 may include side panels 140 that partially or fully enclose equipment mounted within the base unit 110.

The equipment enclosure 100 is shown in FIG. 1 in a shippable un-extended state 100A. In some embodiments, the equipment enclosure 100 is filled with equipment, by mounting the equipment on the rack rails 130, previous to shipping. In other embodiments, the equipment enclosure 100 is filled with equipment subsequent to installation. In the depicted embodiment, the height of the enclosure is less that 42 U (e.g., 40 U) which enables the use of standard shipping services and the ability to enter a facility via standard doorways. [Note: A 'U' is a standard height measurement unit for rack mount equipment specified by EIA spec 310-D and is equal to approximately 1.75 inches or 44.5 mm.]

Figure 2:
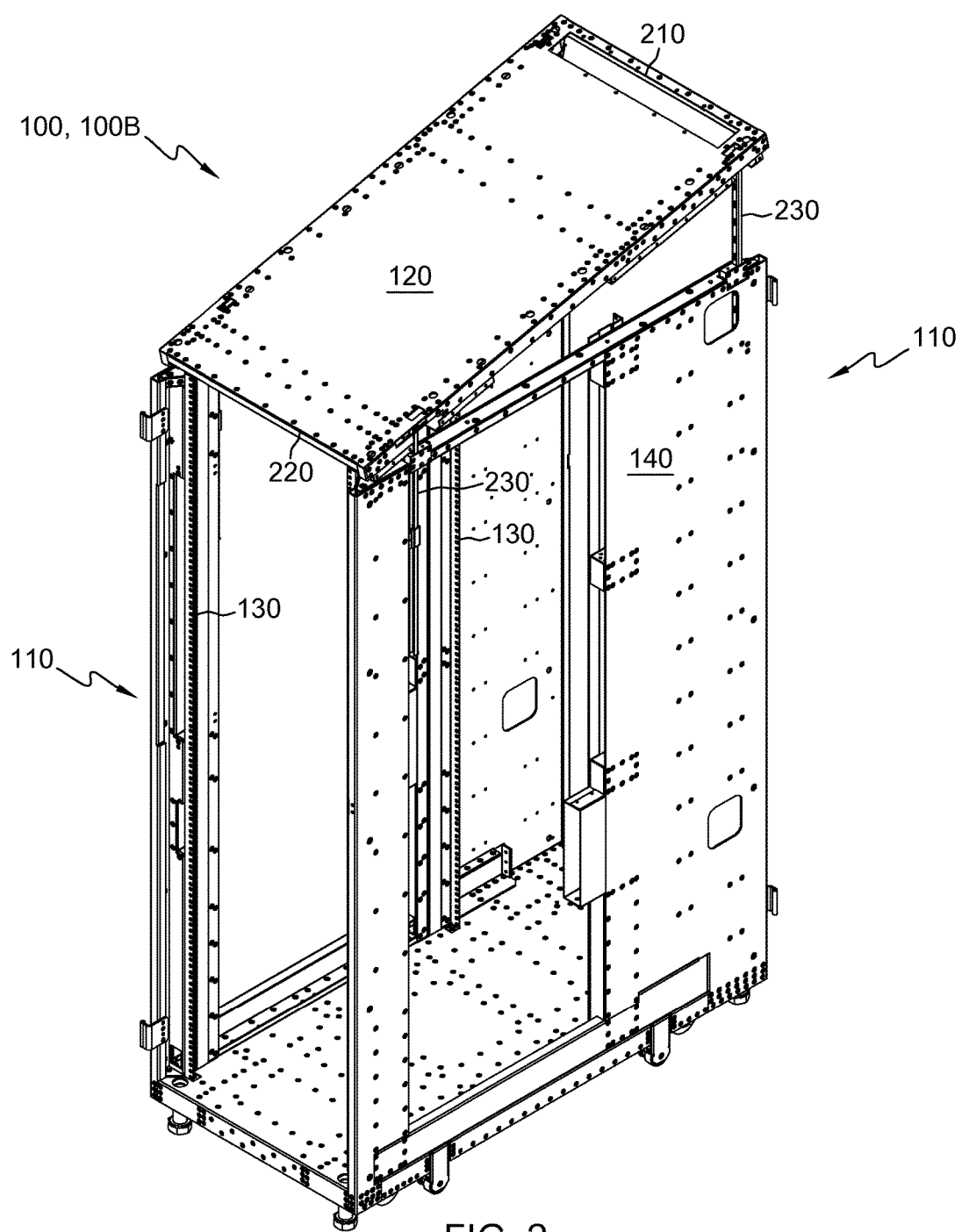
FIG. 2 is a perspective view illustration depicting one embodiment of an equipment enclosure in a partially extended state.

FIG. 2 is a perspective view illustration depicting one embodiment of the equipment enclosure 100 in a partially extended state 100B. As depicted, a back end 210 of the top panel 120 has been raised by an installer to an extended state while a front end 220 of the top panel remains in an un-extended state. One or more extension arms 230 enable an installer to raise the back end of the top panel without completely detaching the top panel 120 from the base unit 110. In the depicted embodiment, the base unit 110 is provided with detent mechanisms that snap into receiving holes (see FIG. 8) on the extension arms 230 and enable adjustable extension of the extension arms 230 and the raising of the top panel 120 in increments of 1 U.

Figure 3:
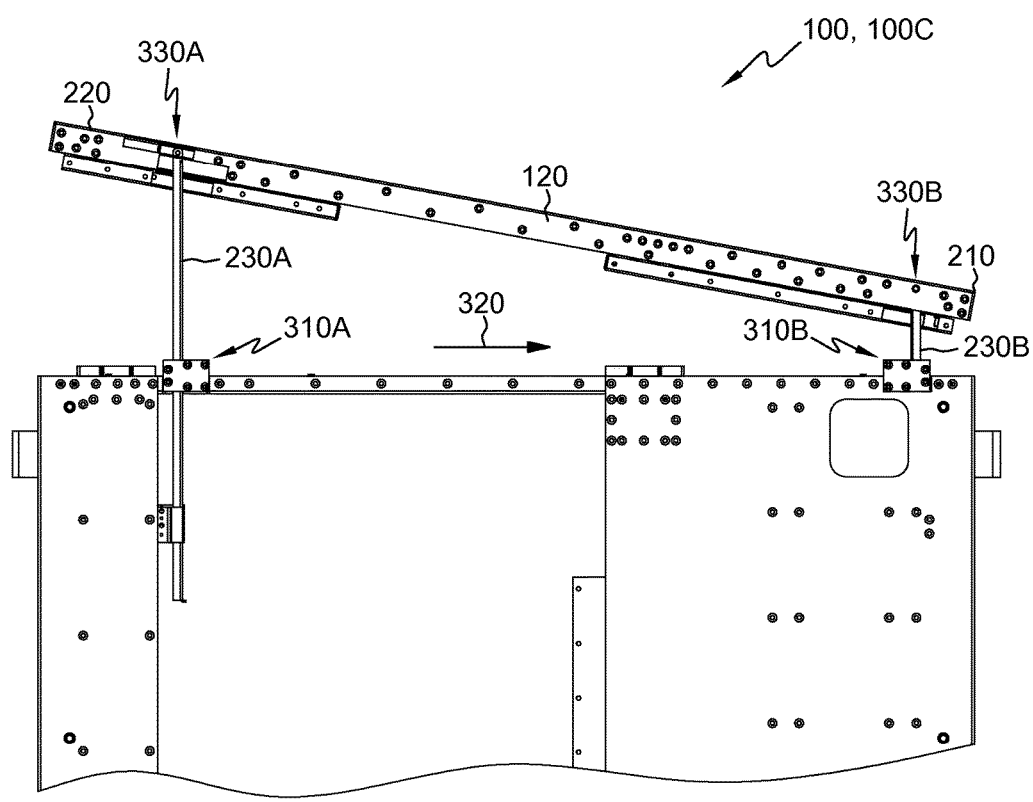
FIG. 3 is a side view illustration depicting selected portions of one embodiment of an equipment enclosure in a partially extended state.

FIG. 3 is a side view illustration depicting selected portions of one embodiment of the equipment enclosure 100 in a partially extended state 100C. In contrast to FIG. 2, FIG. 3 shows that the front end 220 of the top panel has been raised by an installer to an extended state while the back end 210 of the top panel is in a substantially un-extended state.

FIG. 3 also shows that a first extension arm 230A is vertically extendable from a proximal position 310A along a selected dimension 320 of the base unit and a second extension arm 230B that is vertically extendable from a distal position 310B along the selected dimension 320 of the base unit. Furthermore, the first extension arm 230A is slide-ably coupled (330A) to the top panel 120 and the second extension arm 230B is rotate-ably coupled (330B) to the top panel 120. By slide-ably coupling the top panel to at least one extension arm 230, the angle of the top panel may vary while the extension arms 230 remain at the same positions 310 along the selected dimension 320.

In the depicted embodiment, matching extension arms 230 and couplers 330 on the opposite side of the equipment enclosure 100 (that are hidden from view in FIG. 3 but partially viewable in FIG. 6) are at the same distal positions 310 along the selected dimension 320. Maintaining the same distal positions 310 enables tilting of the top panel 120 and raising one end of the top panel previous to raising the other end. In another non-depicted embodiment, one or both of the extension arms 230 do not have a matching extension arm on the opposite side of the equipment enclosure 100. For example, the extension arm 230A could be on one side of the equipment enclosure 100 at distal position 310A and the extension arm 230B could be on the opposite side of the equipment enclosure 100 at distal position 310B.

Figure 4:
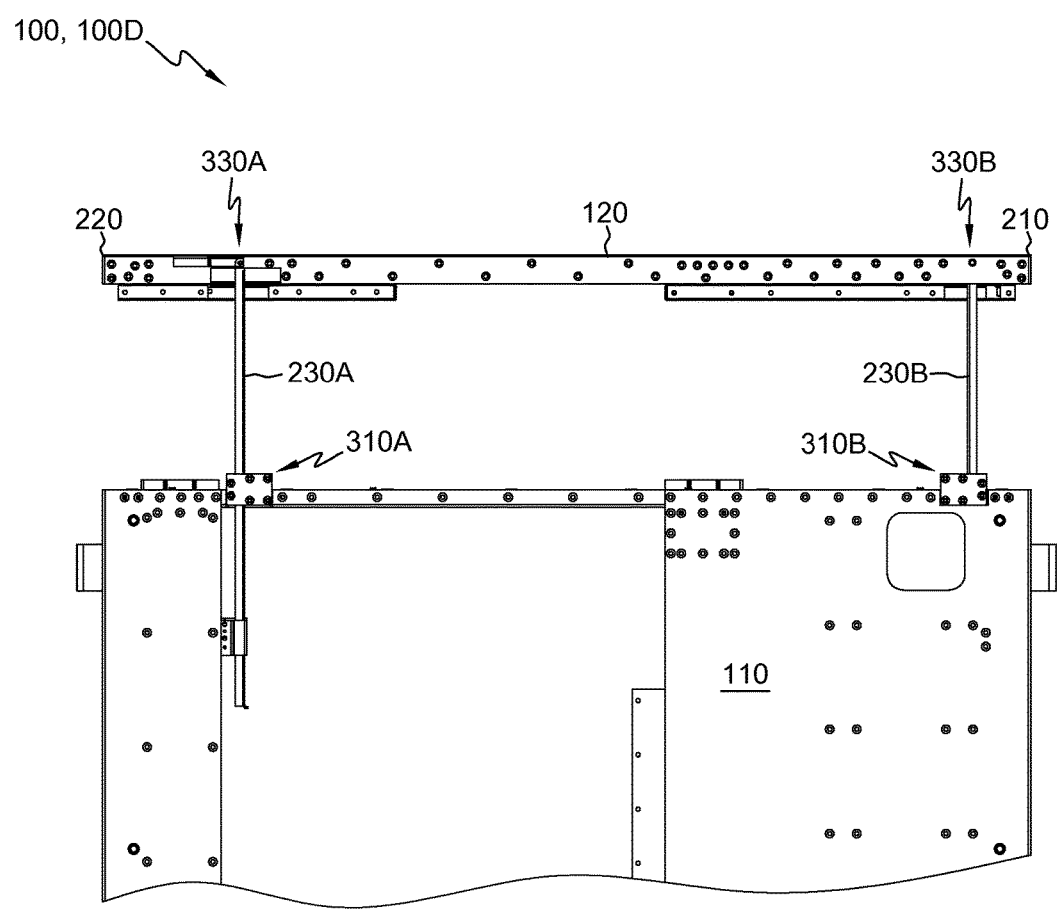
FIG. 4 is a side view illustration depicting selected portions of one embodiment of an equipment enclosure in an extended state.

FIG. 4 is a side view illustration depicting selected portions of one embodiment of the equipment enclosure 100 in an extended state 100D. As depicted, both the back end 210 and the front end 220 of the top panel 120 have been raised by an installer to the extended state 100D. Consequently, the top panel 120 is at a level orientation despite being tilted during the vertical extension process. The top panel 120 may be raised while electronic equipment is operating within the base unit 110 without disrupting the electronic equipment.

Figure 5:
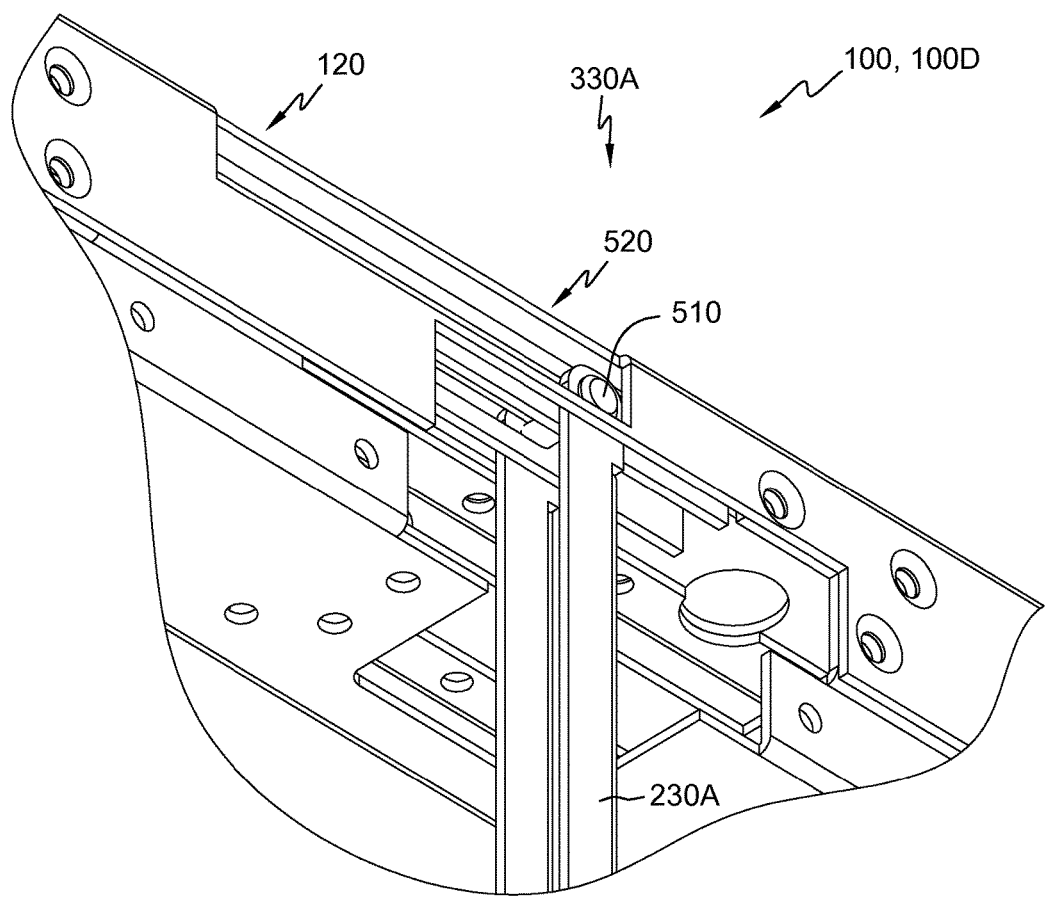
FIG. 5 is a perspective view illustration depicting selected portions of one embodiment of an equipment enclosure in an extended state.

FIG. 5 is a perspective view illustration depicting selected portions of one embodiment of the equipment enclosure 100 in the extended state 100D. As depicted, the selected portions include the extension arm 230A with a sliding pin 510 that protrudes into a slot 520 and enables slide-able coupling (330A) of the extension arm 230A to the slot 520 and the top panel 120. The length of the coupling slot 520 may be selected to correspond to the maximum extension distance of the extension arm 230A.

Referring back to FIGS. 1-4, the slide-able coupling (330A) between the extension arm 230A and the top panel 120 enables the total distance between the coupling points 330A and 330B to vary during the extension process while the lateral distance between the extension arms 230A and 230B of the base unit remains constant. For example, as one end of the top panel is raised, the total distance between the coupling points 330A and 330B increases. Subsequently, when the other end of the top panel is raised, the total distance between the coupling points 330A and 330B decreases. In the depicted embodiment, the top panel tilts during the extension process along the selected dimension 320 which corresponds to the depth of the enclosure 100. However, in other embodiments other configurations are possible.

Figure 6:
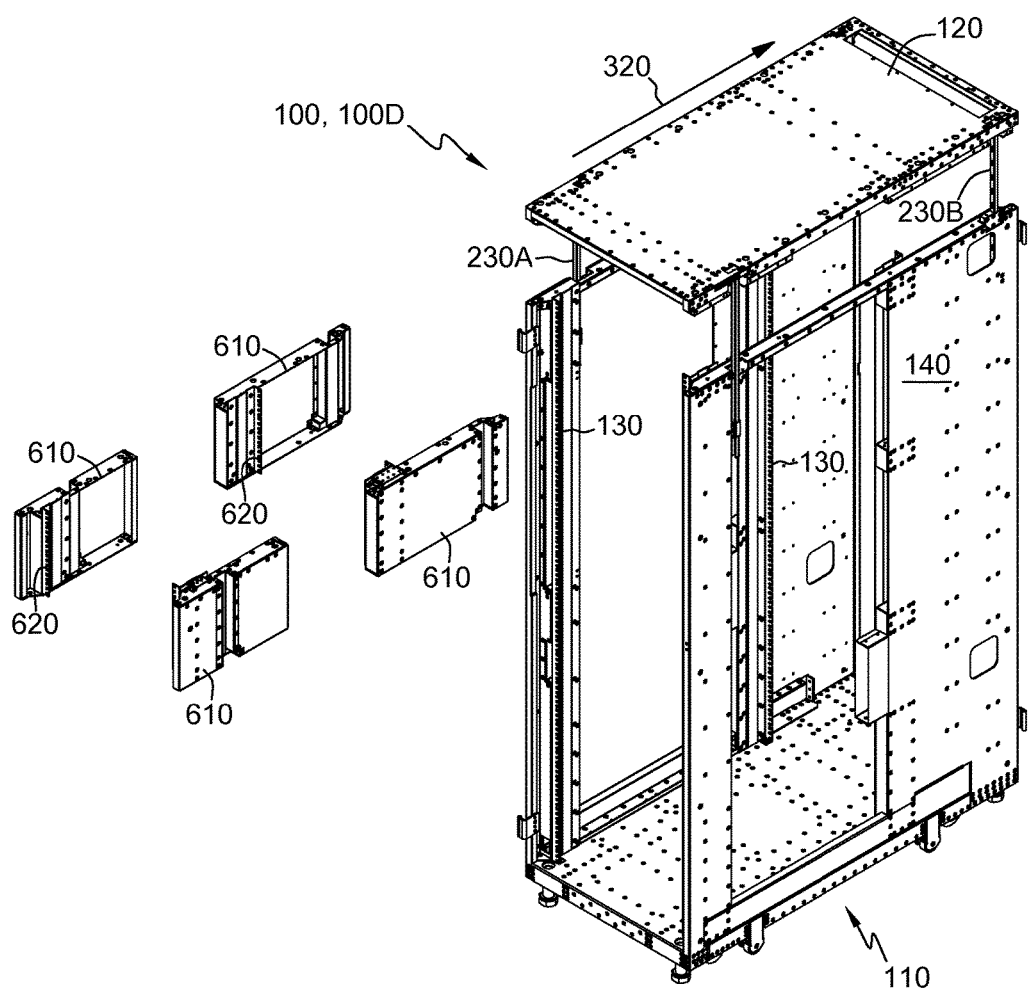
FIG. 6 is a perspective view illustration depicting one embodiment of an equipment enclosure in an extended state just previous to installation of a set extension panels.

FIG. 6 is a perspective view illustration depicting one embodiment of the equipment enclosure 100 in the extended state 100D just previous to installation of a set extension side panels 610. In the depicted embodiment, there are two extension side panels 610 for each side of the enclosure. However, the invention is not limited to two extension side panels 610 for each side of the enclosure.

In some embodiments, such as the depicted embodiment, the extension side panels 610 are installable from the interior of the enclosure which enables in-situ installation of the panels while the equipment enclosure 100 is adjacent to other extended height enclosures. The depicted extension side panels 610 also include rack rails 620 to which electronic equipment may be rack mounted.

Figure 7:
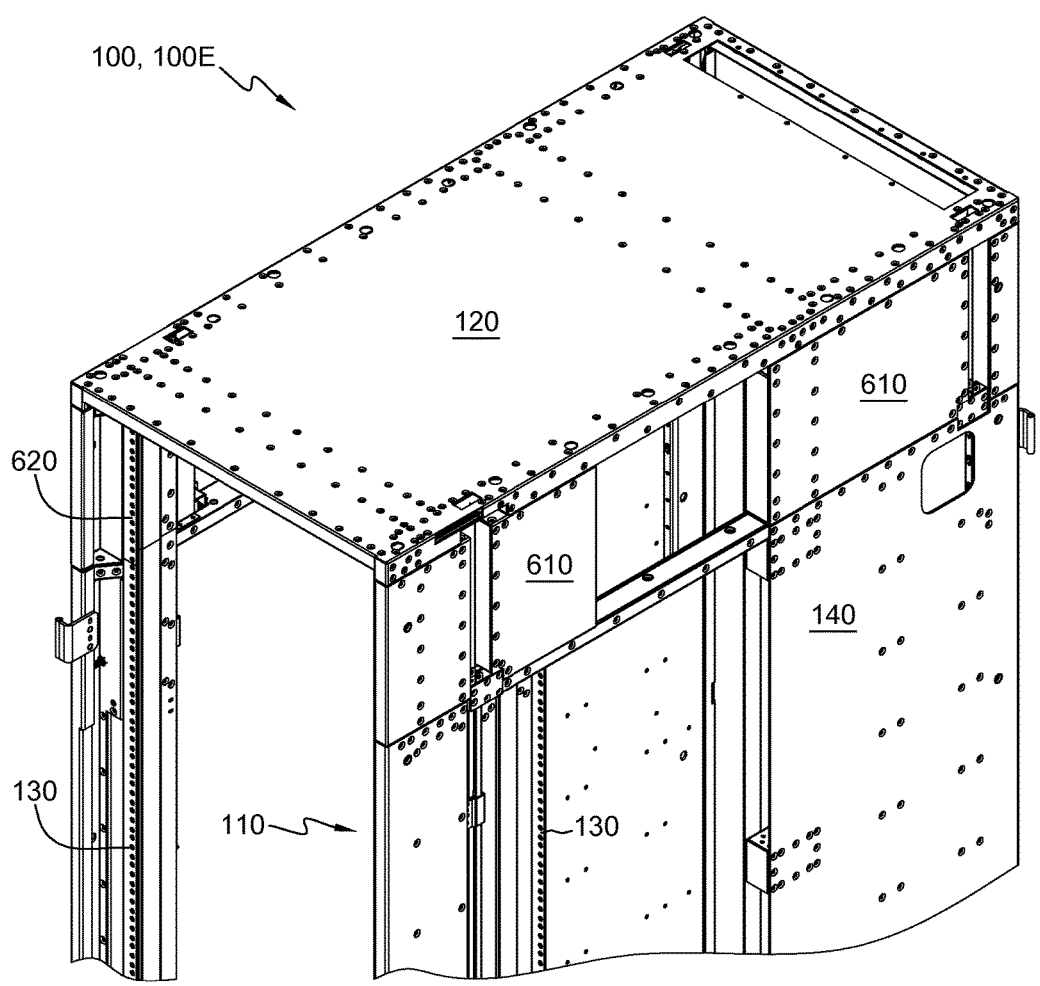
FIG. 7 is a perspective view illustration depicting one embodiment of an equipment enclosure in an extended state after installation of a set extension panels.

FIG. 7 is a perspective view illustration depicting one embodiment of the equipment enclosure 100 in an extended state 100E after installation of the extension panels 610. The depicted extension panels 610 include rack rails 620 that align with the rack rails 130 to form a continuous set of rails for the extended enclosure. Consequently, equipment may be mounted that bridges the base unit 110 and the extension panels 610. The height of the depicted enclosure 100 in the extended state 100E is greater than 46 U.

Figure 8:
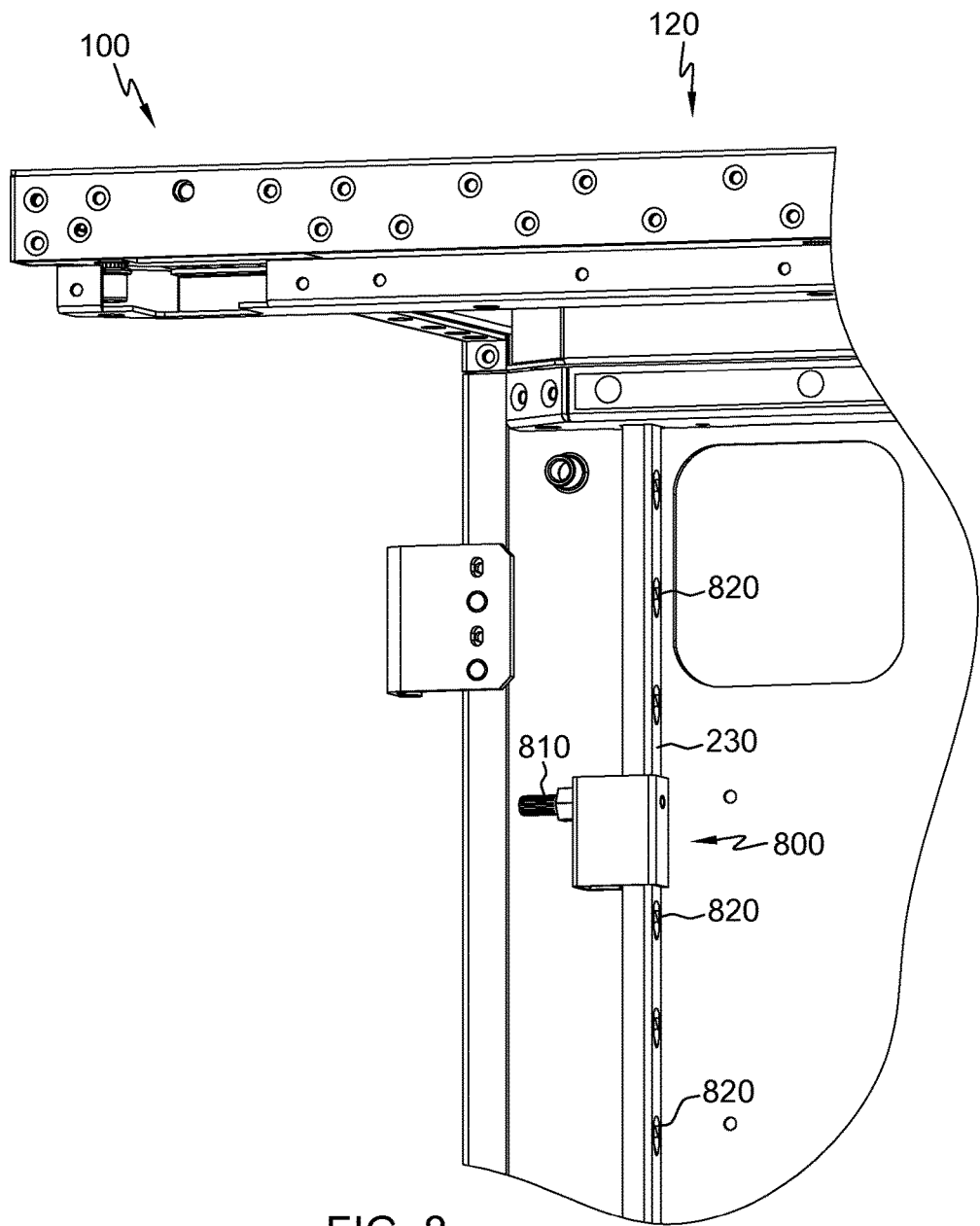
FIG. 8 is a perspective view illustration depicting selected portions of one embodiment of an equipment enclosure.

FIG. 8 is a perspective view illustration depicting selected portions of one embodiment of the equipment enclosure 100. As depicted, the equipment enclosure 100 includes a detent mechanism 800 than enables vertical extension of an extension arm 230. The height of the top panel may be adjusted by an installer and held in place by the detent mechanism 800. In some embodiments, each extension arm 230 is provided with the detent mechanism 800.

The depicted detent mechanism 800 includes a retractable spring-loaded detent 810 (the spring of the spring-loaded detent 810 is internal to the detent mechanism 800 and is not visible in FIG. 8) that mates with a selected receiving hole (also not visible in FIG. 8) of a set of receiving holes 820. Each receiving hole 830 corresponds to a different extension distance for the top panel 120. In some embodiments, the receiving holes are angled or shaped such that raising the top panel pushes the retractable spring-loaded detent 810 out of the receiving hole 830 without requiring manual retraction of the retractable spring-loaded detent 810. However, with the described embodiments, the receiving holes may also be angled or shaped to inhibit lowering of the top panel 120 without manual retraction of the retractable spring-loaded detent 810. Consequently, the extension arm 230 and top panel 120 may be ratcheted upward to a selected height by a single installer and then held in place without requiring the installer to manually retract the retractable spring-loaded detent 810.

Figure 9:
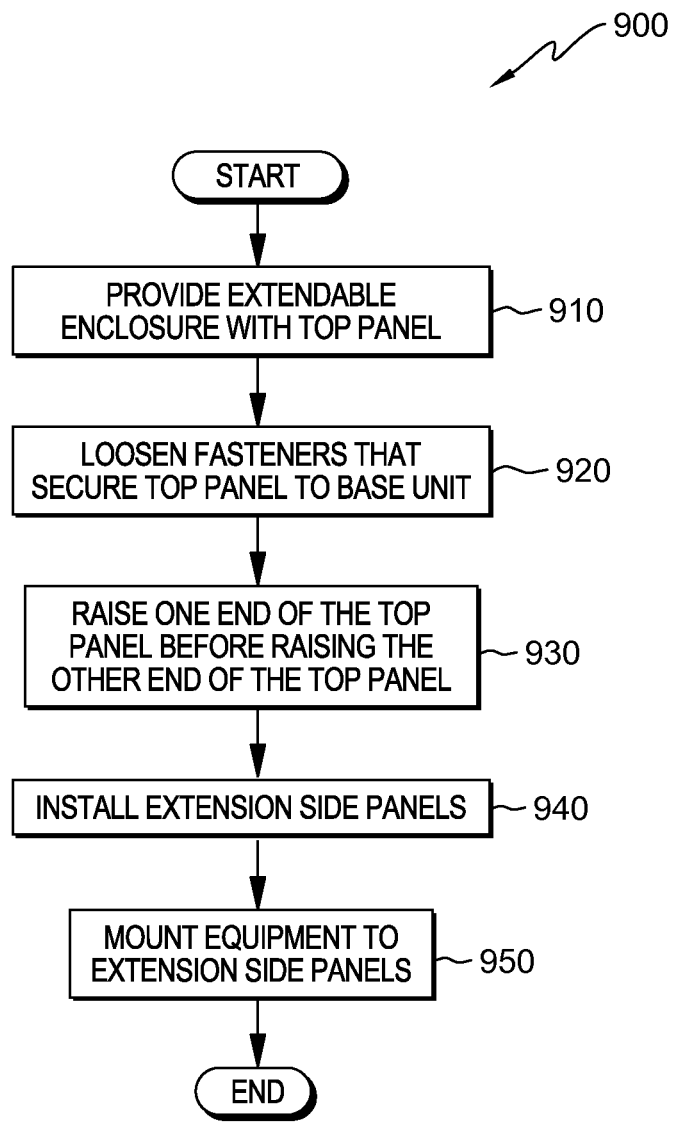
FIG. 9 is a flowchart depicting one embodiment of an enclosure extension method.

FIG. 9 is a flowchart depicting one embodiment of an enclosure extension method 900. As depicted, the enclosure extension method 900 includes providing (910) an extendable enclosure with a top panel, loosening (920) fasteners, raising (930) one end of the top panel followed by the other end of the top panel, installing (940) extension side panels, and installing (950) equipment in the extension region of the enclosure.

Providing (910) an extendable enclosure with a top panel may include providing an enclosure, such as the enclosure 100, with a top panel that is rotate-ably coupled at one point and slide-ably coupled at another point along a selected dimension (e.g., along the depth of the enclosure) to a set of extension arms. In one embodiment, each side of the enclosure has a slide-able coupler at a proximal point along the selected dimension and a rotatable coupler at a distal point along the selected dimension. The slide-able coupler(s) that enable(s) slide-able coupling may also enable rotatable coupling.

Loosening (920) fasteners may include loosening fasteners that secure the extendable enclosure during shipping. For example, one or more fasteners may secure a top panel of an extendable enclosure to a base unit and inhibit extension of the enclosure generally, and of the top panel specifically, from an un-extended state to an extended state.

Raising (930) one end of the top panel followed by the other end of the top panel may include a single installer, or the like, separately (i.e., sequentially) raising a front end and a back end of the top panel. The front and back end of the top panel may be raised separately from each other due to one or more slide-able couplers that couple one or more extension arms that extend from the base unit to the top panel. The slide-able couplers enable a total distance between coupling points on the top panel to increase as one end is raised and then decrease as the other end is raised despite being offset by a fixed lateral distance. Furthermore, one or more rotatable couplers enable the top panel to be tilted and one end of the top panel to be raised before the other end of the top panel. The slide-able couplers may also provide rotatable coupling between the top panel and the extension arms.

Installing (940) extension side panels may include installing one or more side panels in the extension region of the enclosure that prevent the top panel from lowering. The side panels may be rigid and enable the mounting of equipment in the extension region of the enclosure. For example, the side panels may have rack rails that enable the mounting of rack mountable equipment.

Installing (950) equipment in the extension region of the enclosure may include mounting equipment on the rack rails provided by the extension side panels.

The embodiments disclosed herein provide an equipment enclosure that can be shipped in an un-extended state and extended in height by a single individual during installation.

One of skill in the art will appreciate that a variety of adjustments may be made to the depicted embodiments that fit within the spirit and intent of the claimed invention. Consequently, it should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus comprising:
   a base unit configured to hold electronic equipment;
   a first extension arm that is laterally restrained and, without pivoting, is vertically extendable from a proximal position along a selected dimension of the base unit;
   a second extension arm that is laterally restrained and, without pivoting, is vertically extendable from a distal position along the selected dimension of the base unit; and
   the first extension arm slide-ably coupled to a top panel and the second extension arm rotate-ably coupled to the top panel.

2. The apparatus of claim 1, wherein the top panel may be raised while the electronic equipment is operating without disrupting the electronic equipment.

3. The apparatus of claim 1, wherein the base unit comprises a plurality of side panels.

4. The apparatus of claim 1, wherein the top panel comprises a slot for slide-ably coupling the first extension arm to the top panel.

5. The apparatus of claim 4, wherein the first extension arm comprises a sliding pin that protrudes into the slot and enables slide-able coupling to the slot.

6. The apparatus of claim 1, wherein the base unit is less than 43 U in height.

7. The apparatus of claim 1, wherein the base unit includes a detent mechanism.

8. The apparatus of claim 7, wherein the first extension arm comprises a plurality of holes for receiving the detent and holding the first extension arm at a selected vertical extension distance.

9. The apparatus of claim 7, wherein the second extension arm comprises a plurality of holes for receiving the detent and holding the second extension arm at a selected vertical extension distance.

10. The apparatus of claim 1, further comprising a plurality of fasteners for securing the top panel to the base unit for shipping.

11. The apparatus of claim 1, further comprising a plurality of extension side panels.

12. The apparatus of claim 11, wherein the plurality of extension side panels are installable from an interior extension region below a vertically raised top panel.

13. The apparatus of claim 11, wherein the base unit comprises a first plurality of rack rails for mounting electronic equipment.

14. The apparatus of claim 13, wherein the plurality of extension side panels comprise a second plurality of rack rails for mounting electronic equipment.

15. The apparatus of claim 14, wherein the first plurality of rack rails and the second plurality of rack rails form a continuous set of rails when the extension side panels are installed below the vertically raised top panel.

16. A method comprising:
    providing an enclosure comprising a base unit and a first extension arm that is laterally restrained and, without pivoting, is vertically extendable from a proximal position along a selected dimension of the base unit and a second extension arm that is laterally restrained and, without pivoting, is vertically extendable from a distal position along the selected dimension of the base unit, the first extension arm slide-ably coupled to a top panel and the second extension arm rotate-ably coupled to the top panel; and
    raising one end of the top panel before raising the other end of the top panel.

17. The method of claim 16, further comprising installing a plurality of extension side panels.

18. The method of claim 16, wherein the plurality of extension side panels comprise a plurality of rack rails.

19. The method of claim 18, further comprising mounting equipment to the plurality of rack rails.

20. The method of claim 16, further comprising loosening one or more fasteners.

* * * * *